US011907622B2

(12) United States Patent
Benneckenstein

(10) Patent No.: US 11,907,622 B2
(45) Date of Patent: Feb. 20, 2024

(54) SIMULATION CONTROLLER, SYSTEM AND METHOD FOR SIMULATING A RADAR SCENARIO

(71) Applicant: Rohde & Schwarz GmbH & Co. KG, Munich (DE)

(72) Inventor: Tim Benneckenstein, Bad Tölz (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 326 days.

(21) Appl. No.: 16/912,851

(22) Filed: Jun. 26, 2020

(65) Prior Publication Data

US 2021/0406419 A1    Dec. 30, 2021

(51) Int. Cl.
*G06F 30/20* (2020.01)
*G01S 13/88* (2006.01)
*G01S 7/28* (2006.01)

(52) U.S. Cl.
CPC ............... *G06F 30/20* (2020.01); *G01S 7/28* (2013.01); *G01S 13/88* (2013.01)

(58) Field of Classification Search
CPC . G06F 30/20; G01S 7/28; G01S 13/88; G01S 7/4052; G01S 7/4065; G01S 13/24; G01S 13/34
See application file for complete search history.

(56) References Cited

U.S. PATENT DOCUMENTS

| 2017/0322289 | A1* | 11/2017 | Benneckenstein .... G01S 7/4052 |
| 2020/0193326 | A1* | 6/2020 | Leabman ............... G06N 20/00 |
| 2020/0358462 | A1* | 11/2020 | Perthold ............... H04B 1/0014 |
| 2021/0341571 | A9* | 11/2021 | Gruber ................. G01S 7/4052 |

FOREIGN PATENT DOCUMENTS

| CN | 110045343 B | * | 1/2020 |
| JP | 2004108797 A | | 4/2004 |

* cited by examiner

*Primary Examiner* — Bernarr E Gregory
*Assistant Examiner* — Juliana Cross
(74) *Attorney, Agent, or Firm* — Westman, Champlin & Koehler, P.A.

(57) ABSTRACT

The invention relates to a versatile generation of radar signals for simulating a radar scenario. Radar signals may be generated by multiple RF output paths having different frequency ranges. Pulse descriptive words of radar signal simulation data are split into multiple groups according to the frequency or frequency range of the RF output paths and the split data are provided to the related RF output path.

9 Claims, 4 Drawing Sheets

SIMULATION CONTROLLER, SYSTEM AND METHOD FOR SIMULATING A RADAR SCENARIO

TECHNICAL FIELD

The present invention relates to a simulation controller for controlling a system for simulating a radar scenario. The present invention further relates to a system and method for simulating a radar scenario.

BACKGROUND

Although applicable in principle to any kind of signal generation, the present invention and its underlying problem will be hereinafter described in connection with the generation of radio frequency signals for testing a radar receiver.

For testing and development of radar receivers, the radar receivers may be tested with complex pulse sequences, e.g. pulse sequences having a maximum pulse rate. The pulses of such a sequence may cover a wide frequency range.

Since the frequency range of a signal generator for generating such test pulses is limited, a center frequency of the signal generator has to be changed during operation. However, such a change of the center frequency may lead to a dead time during which no pulses can be generated. Consequently, pulses falling in such a dead time cannot be generated and are lost.

Thus, there is a need in order to improve the generation of radio frequency pulses, for example pulses in a radar sequence covering a wide frequency range.

Against this background, the present invention aims to provide an improved generation of signal in a signal sequence, in particular an improved generation of radio frequency pulses in a radar scenario. For this purpose, the present invention aims to provide an improved and versatile generation of radar signals for simulating a radar scenario.

SUMMARY

The present invention provides a simulation controller, a system for simulating a radar scenario and a method for simulating a radar scenario with the features of the independent claims. Further advantageous embodiments are subject matter of the dependent claims.

According to a first aspect, a simulation controller for controlling a system for simulating a radar scenario is provided. The simulation controller comprises an output interface and a control unit. The output interface is configured to provide pulse descriptive words (PDW) of radar signals to a number of at least two radio frequency (RF) output paths. Each RF output path may generate radar signals according to the received pulse descriptive words. The harder signals of different RF output paths may relate to different frequency bands. The control unit is configured to split the radar signals of a radar signal scenario data into multiple groups of radar signals. In particular, the multiple groups of radar signals may relate to different frequency bands. The control unit is further configured to assign each group of radar signals to a corresponding RF output path.

According to a further aspect, a system for simulating a radar scenario is provided. The system comprises a number of at least two radio frequency output paths and a simulation controller. Each RF output path is configured to generate are signals. The further signals of different RF output paths may relate to different frequency bands. The simulation controller comprises an output interface and a control unit. The output interface is configured to provide PDW of radar signals of predetermined radar signal scenario data. In particular, the output interface may provide the PDW of radar signals to the number of at least two RF output paths. The control unit is configured to split the radar signals of the radar signal scenario data into multiple groups of radar signals. The multiple groups of radar signals may relate to different frequency bands. The control unit is further configured to assign each group of radar signals to a corresponding RF output path.

According to still a further aspect, a method for simulating a radar scenario is provided. The method comprises a step of splitting radar signals of predetermined radar signal scenario data into multiple groups of radar signals. The multiple groups of radar signals may relate to different frequency bands. The splitting of the radar signals may be performed by a control unit. The method further comprises a step of providing PDW for each group of radar signals to a corresponding RF output path. Each RF output path may generate radar signals according to the received PDW. The radar signals of different RF output paths may relate to different frequency bands.

The present invention is based on the finding that a simulation of complex radar scenarios may require complex pulse sequences over a wide frequency range. Since a frequency range of signal generators for generating such radar signals is limited, it may be necessary to adapt a center frequency of a related signal generator when outputting a complex radar sequence covering a wide frequency range. However, each time a center frequency is adapted, a short interruption, i.e. a dead time occurs. During this interruption, no radar signals can be generated. Thus, radar signals in a signal sequence which shall be transmitted during this interruption are lost.

The present invention takes into account this finding and aims to provide an improved generation of a radar sequence covering a wide frequency range. Further to this, the present invention aims to provide an improved and versatile generation of complex radar sequences which may comprise even interleaved radar pulses.

The present invention therefore provides a simulation controller for controlling a generation of complex radar sequences which can use multiple radio frequency output paths simultaneously. Each RF out path may operate in a specific frequency band. In this way, each radar signal may be processed by an appropriate RF output path operating in the respective frequency band. Thus, the RF output paths all may operate in constant frequency bands and there is no need to change the operation parameters such as a center frequency or the like during the generation of a radar sequence. Consequently, gaps in the generation of radar signals can be avoided and complex radar frequency sequences for a wide frequency range can be generated without skipping any radar signals.

In order to control the generation of the radar signals by the multiple RF output paths, the simulation controller may divide the radar signals of a radar sequence into multiple groups, wherein each group relates to radar signals of a frequency range corresponding to the frequency range of the related RF output path. Accordingly, the simulation controller can assign the individual radar signals of a radar sequence to the related RF output path which is operating in the respective frequency band. In this way, all RF signals of a radar signal are provided to appropriate RF output paths by the simulation controller.

By providing the RF signals of a radar sequence to multiple output paths and controlling the respective RF output paths accordingly, even complex radar sequences can be generated by multiple conventional RF output paths, each having only limited frequency range. Thus, complex radar scenarios can be simulated by use of relative simple and cheap hardware components.

The simulation controller may comprise a processor for performing the desired operations. For example, the processor may be a central processing unit (CPU). The processor may execute an operating system that loads and executes software code. For example, the processor may be an Intel or AMD processor that runs an operating system that loads and executes instructions of software code stored in a program memory of the simulation controller. However, any other kind of processor may be possible which can load and execute instructions of a software code from a related memory. For this purpose, the processor may be communicatively coupled with a program memory of the simulation controller. For example, the processor may comprise a memory interface for reading the software code stored in the program memory.

The program memory may be any kind of appropriate memory for storing the software code. For example, the program memory may be a non-volatile random access memory. However, the program memory may be also a read-only memory or any other kind of memory which can store the software code and provide the software code to the processor of the simulation controller.

The radar signal scenario data may be any kind of data for specifying a desired radar sequence. For example, the radar signal scenario data may be stored in a scenario memory of the simulation controller. This scenario memory may be, for example a random access memory. However, any other kind of memory, in particular a read-only memory or the like may be possible, too. The radar signal scenario data may be provided to the simulation controller by a communication interface. Accordingly, the simulation controller may receive the radar signal scenario data from a remote device and store the radar signal scenario data in the scenario memory. However, it may be also possible to provide the radar signal scenario data by an external memory device, for example a USB stick, a secure data (SD) card or any other external memory device. Furthermore, it may also possible to provide the radar signal scenario data to the simulation controller in real-time from a remote device via communication interface. It is understood, that any other appropriate manner for providing the radar signal scenario data to the simulation controller may be possible, too.

The radar signal scenario data may specify, for example, a sequence of radar pulses. In particular, specific parameters for each radar pulse may be provided. The specific parameters may specify, for example, a duration of a pulse, a frequency or frequency range, an amplitude or a signal strength, a modulation or any other characteristic of the pulses of the radar sequence. For example, it may be possible to specify each radar pulse separately. However, it may be also possible to provide specifications relating to multiple pulses in common, or, for example, parameters for specifying periodicity or the like of radar pulses. However, it is understood, that any other manner for specifying the radar pulses of a radar sequence may be possible, too.

The simulation controller may be communicatively coupled with the multiple RF output paths. For example, a wired communication link may be provided between the simulation controller, in particular the output interface of the simulation controller and the individual RF output paths. The communication links may be established, for example, by an appropriate network connection or the like. However, any other kind of communication link between the output interface of the simulation controller and the RF output paths may be possible, too.

Each RF output path may comprise an appropriate device for generating RF signals, in particular radar signals based on the data provided from the simulation controller. For this purpose, the RF output paths may comprise appropriate signal generators such as a vector signal generator or the like. However, any other appropriate device for generating radar signals according to the data provided from the simulation controller may be possible, too.

The output signals of the individual RF output paths may be provided to a device under test separately. However, it may be also possible to combine the output signals of the multiple RF output paths to a common signal.

Further embodiments of the present invention are subject of the further subclaims and of the following description, re-ferring to the drawings.

In a possible embodiment, the control unit of the simulation controller is configured to control an operation of the number of at least two RF output paths simultaneously. Accordingly, the simulation controller does not only split the pulse descriptive words of the radar signal simulation data into multiple groups relating to different bandwidths, but also controls the operation of the signal generation in the multiple RF output paths. In order to cover a radar simulation over a wide frequency range, the simulation controller may control the multiple RF output paths simultaneously. Accordingly, there is no gap in the operation when switching from one output path to another or even when outputting radar signals by multiple RF output paths simultaneously.

In a possible embodiment, the control unit of the simulation controller is configured to assign radar signals to at least two RF output paths simultaneously. In particular, the control unit may assign radar signals to even all RF output paths simultaneously. By simultaneously assigning radar signals to multiple RF output paths, it is possible to provide a radar simulation with multiple radar signals over a wide frequency range at a same point in time. In this way, even complex radar scenarios can be simulated.

In a possible embodiment, the control unit of the simulation controller is configured to assign multiple radar signals to a same RF output path simultaneously. Accordingly, it is possible to cause the RF output path to generate multiple signals simultaneously in the frequency range of the respective RF output path. In particular, it is possible to interleave multiple RF signals, i.e. the frequency range of the radar signals overlap at least in part.

In a possible embodiment, at least one of the number of at least two RF output paths is configured to process and output multiple radar signals simultaneously. Accordingly, two or more radar signals may be provided by a single RF output path at a same point in time. The multiple RF signals may be related to different frequency ranges. However, it may be also possible that the RF signals overlap at least in part.

In a possible embodiment, the system for simulating the radar scenario may comprise a combiner. The combiner may be configured to combine the output signals of the number of RF output paths. Accordingly, a common radar sequence with radar signals over a wide frequency range is provided.

In a possible embodiment, the RF output paths may comprise a signal generator. The signal generator may comprise, for example, a vector signal generator. However, any other kind of signal generator for generating the desired RF signals may be possible, too.

With the present invention it is therefore possible to generate signals for simulating complex radar scenarios. By using multiple RF output paths simultaneously, it is possible to adapt each RF output path to a different frequency range. Accordingly, the desired radar signals, for example pulse descriptive words, may be separated into multiple groups according to the frequency ranges of the individual output paths, and each output path is provided with the related data according to its frequency range. In this way, there is no need to change the operation frequency of the individual output path during the simulation of a radar scenario. Accordingly, gaps in the signal generation during a change of the frequency range or the like can be avoided. Furthermore, even complex radar scenarios can be simulated, for example by interleaving multiple radar signals or the like.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures and the drawings, in which.

Figure 1:
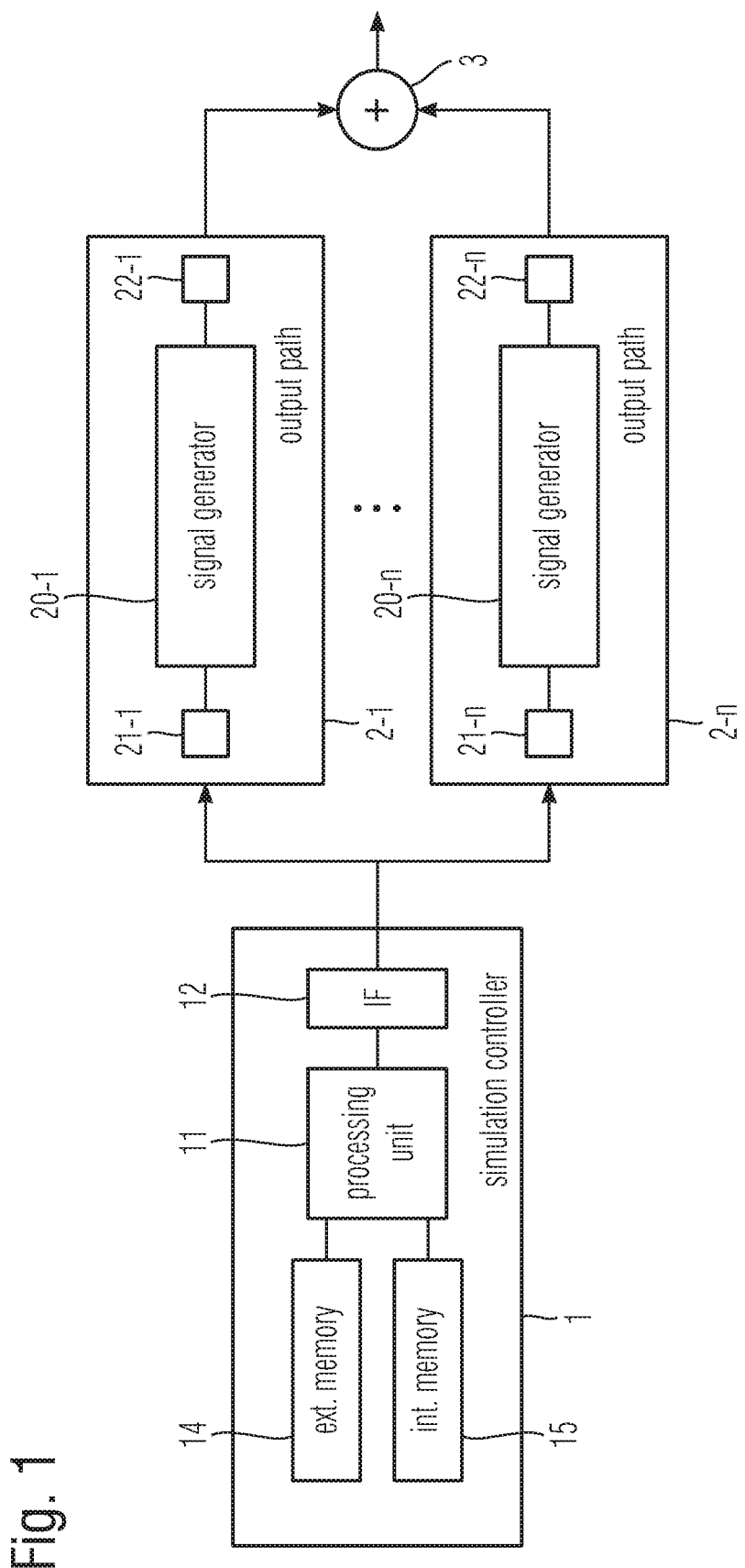
FIG. 1: shows a schematic block diagram of a system for simulating a radar scenario according to an embodiment.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

FIG. 1 shows a schematic block diagram of a system for simulating a radar scenario. The system comprises a simulation controller 1 and a number of two or more radio frequency (RF) output paths 2-$i$. The simulation controller 1 may control operation of the RF output paths 2-$i$ and provide the output paths 2-$i$ with appropriate data for generating radio frequency signals, in particular radar signals. For example, simulation controller 1 may provide the output paths 2-$i$ with pulse descriptive words for specifying the desired radar signals. The simulation controller 1 and the multiple RF output paths 2-$i$ may be communicatively coupled by an appropriate communication link, for example a wired communication link such as a network connection or the like. For this purpose, an output interface 12 of the simulation controller 1 may be connected with an input port 21-$i$ of each RF output path 2-$i$.

Each RF output path 2-$i$ may comprise a signal generator 20-$i$. The signal generators 20-$i$ of the signal paths 2-$i$ may generate radio frequency signals, in particular radar signal based on the respective data received from the simulation controller 1. In particular, each RF output path 2-$i$, especially each signal generator 20-$i$ may generate radio frequency signals of a specific frequency range. The frequency ranges of the individual RF output paths 2-$i$ may be different. In particular, the frequency ranges of the multiple RF output paths 2-$i$ may be adjacent or slightly overlapping. Accordingly, the combination of all signal paths 2-$i$ may result in a continu-ous broad frequency range. However, it may be also possible that there may be some frequency gaps in the frequency range covered by the multiple RF output paths 2-$i$.

The signal generators 20-$i$ of the RF output paths 2-$i$ may be, for example a vector signal generator. However, any other appropriate signal generator for generating the desired radio frequency signals according to the data provided by the simulation controller 1 may be possible, too.

The generated output signals of the individual RF output paths 2-$i$ may be provided at a respective output terminal 22-$i$. In particular, it may be possible to combine the individual output signals by a combiner 3 or the like. Accordingly, a common output signal comprising all radio frequency signals, in particular all radar signals of the individual RF output paths 2-$i$ can be provided.

The operation of the individual RF output paths 2-$i$ is controlled by simulation controller 1. For this purpose, simulation controller 1 may provide the RF output paths 2-$i$ with appropriate control commands. Further to this, simulation controller 1 may provide the RF output paths with data for generating the desired radio frequency signals. In particular, the data for describing or defining the desired output signals may comprise pulse descriptive words of radar signals. Pulse descriptive words (PDW) describe the parameters of radar pulses. Based on such PDW, each output path 2-$i$ may generate appropriate radar signals.

Simulation controller 1 may refer to predetermined radar signal scenario data and provide the RF output paths 2-$i$ with control commands and PDW data according to the predetermined radar signal scenario data. For this purpose, simulation controller 1 may analyze the radar signal scenario data and split the radar signals in the radar signal scenario data into multiple groups. In particular, a separate group of radar signals is generated for each RF output path 2-$i$ according to the frequency range of the respective RF output path 2-$i$. For example, simulation controller 1 may analyze the frequency or frequency spectrum of a desired radar signal and assign the radar signal to one of the RF output paths 2-$i$ accordingly. After assigning the radar signals to the respective RF output path 2-$i$, the respective data, for example the PDW data may be sent to the respective RF output path 2-$i$. For example, the simulation controller 1 may send the data to the respective RF output path 2-$i$ in real-time for causing the RF paths 2-$i$ to generate the radar signal. The radar signal scenario data which are used by the simulation controller 1 may be radar signal scenario data which are stored in a local scenario memory 13 of the simulation controller 1. This scenario memory 13 may be a random access memory or a non-volatile memory. However, any other kind of memory for storing the radar signal scenario data may be possible, too. Furthermore, the radar signal scenario data may be also provided from an external memory device such as a USB stick, a secure data (SD) card or the like. It may be also possible that the radar signal scenario data may be provided from a remote device via a network connection or the like, and the simulation controller 1 may receive the data by means of an appropriate interface.

The analysis of the radar signal scenario data may be performed, for example, by a processing unit 11 of the simulation controller 1. This processing unit may read the radar signal scenario data from the internal scenario memory 13 or an external memory device 14 and split the radar signals according to the frequency ranges of the connected RF output paths 2-*i*. For this purpose, the frequency ranges of the connected RF output paths 2-*i* may be provided to the simulation controller 1 in any appropriate manner. For example, a user may enter the respective frequency ranges manually. However, it may be also possible that the simulation controller 1 obtains the respective frequency ranges of the connected RF output paths 2-*i* via a communication link, for example the communication link which is also used for providing the radar signal data to the RF output paths 2-*i*. In this way, the configuration of the simulation controller 1 with respect to the frequency ranges of the RF output paths 2-*i* may be performed automatically.

Figure 2:
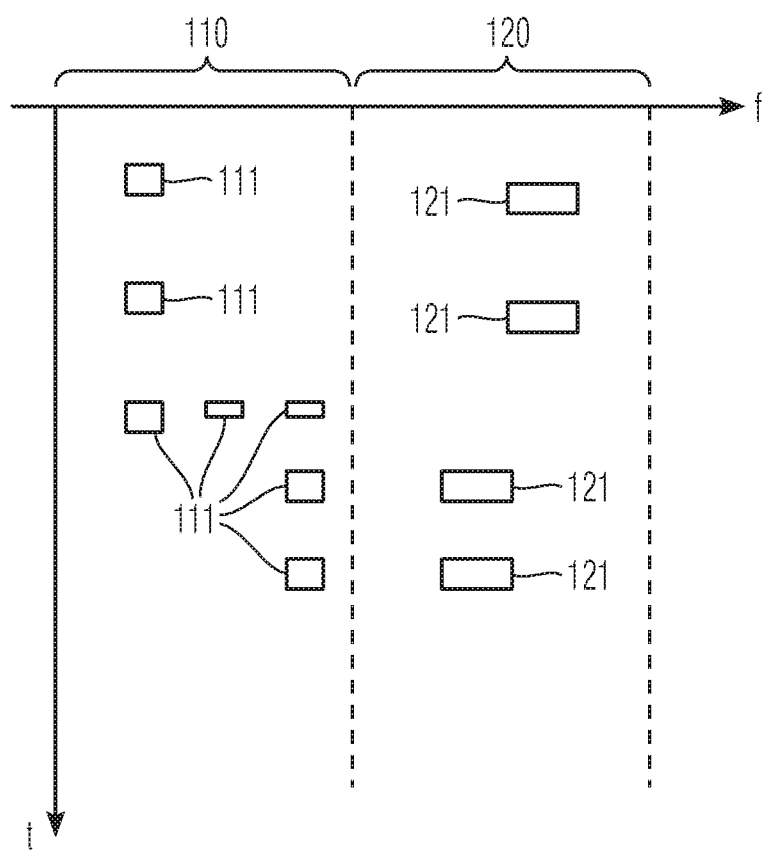
FIG. 2: shows a schematic diagram illustrating a generation of a radar sequence according to an embodiment.

FIG. 2 shows a schematic diagram illustrating the generation of radar signals for simulating a radar scenario according to an embodiment. In this embodiment, two RF output paths 2-*i* are used. However, it is understood that the present invention is not limited to only two RF output paths 2-*i*. Moreover, any number of two or more RF output paths 2-*i* may be possible.

The area indicated by reference sign 110 shows RF signals 111 generated by a first RF output path. The elements shown in section 120 illustrate radar signals 121 generated by a second RF output path. As can be seen in this illustration, it may be possible to switch very fast between RF signals 111 output by the first RF output path and RF signals 121 output by a second RF output path. Moreover, it may be even possible to output RF signals 121 by a first output path and a second output path simultaneously.

Figure 3:
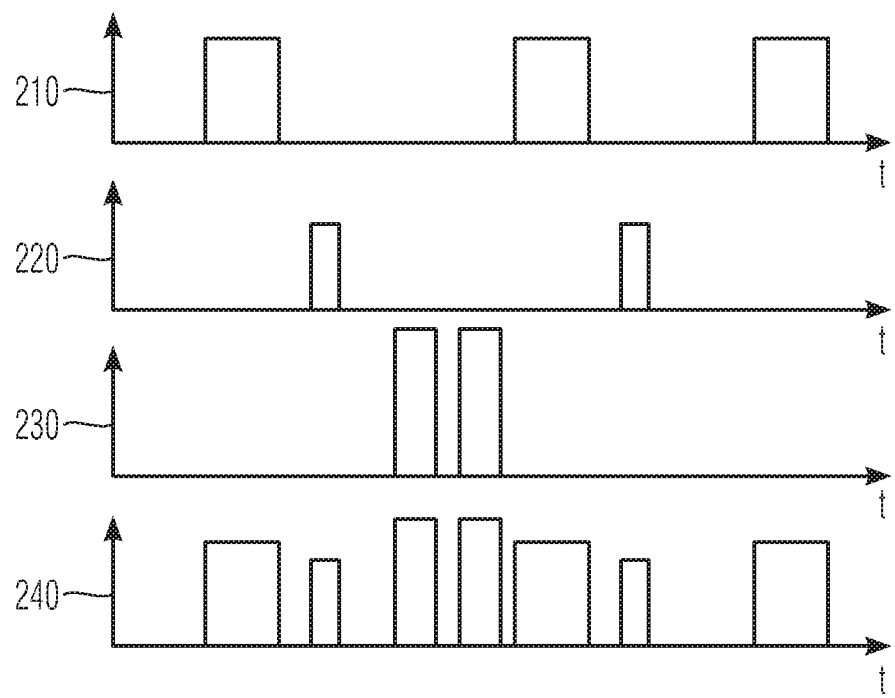
FIG. 3: shows a schematic diagram illustrating a division of radar signals into multiple paths according to an embodiment.

FIG. 3 shows a schematic illustration for illustrating how RF signals, in particular radar signals for a radar signal sequence may be generated by multiple RF output paths in order to obtain a common radar signal sequence. In this example, radar signals are generated by three RF output paths. In the first row radar signals 210 generated by a first RF output path are illustrated. The radar signals generated by this first RF output path may be radio frequency signals within a first frequency range.

In the second row further radio frequency signals 220 are shown which are generated by a second RF output path and accordingly, the third row shows further RF signals 230 generated by a third RF output path. As already mentioned above, each RF output path may generate RF signals of a specific frequency range. In particular, the frequency ranges of the individual RF output paths may be different from each other. Accordingly, simulation controller 1 may control each RF output path 2-*i* to generate radar signals in a respective frequency range. In this way, by combining the output of the three output paths a radar signal sequence as shown in the bottom row of FIG. 3 can be obtained. As can be seen in this illustration, the radar sequence comprises multiple radar signals of different frequency ranges. In particular, it is possible to obtain radar signals relating to different frequency ranges even within a very short period of time.

Figure 4:
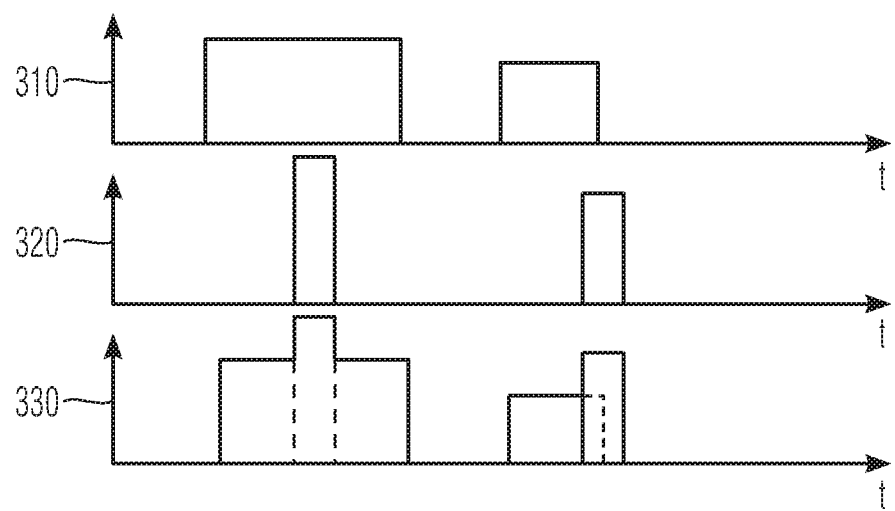
FIG. 4: shows a schematic diagram illustrating interleaving of radar signals as performed by an embodiment.

FIG. 4 shows a further example illustrating a generation of radar signals for simulating a radar scenario. In this example, simulation controller 1 may cause a single RF output path to generate multiple radar signals simultaneously. In the first line, the RF output path is controlled to generate a first RF 310 signal having first characteristics. Simultaneously, simulation controller 1 may control the same RF output path to generate a further RF signal 320 having second characteristics. By combining these two signals 310 and 320, it is possible to obtain a radar signal 330 with two or even more interleaved radio frequency signals. It is understood, that the generation of interleaved radar signals and the generation of radar signals relating to different frequency ranges by multiple RF output paths may be combined.

With the above described operation for generating radar signals for simulating a radar scenario, it is possible to generate complex radar signal sequences. In particular, radar signals relating to a wide range of frequencies can be generated without any temporal gap such as a dead time or the like between individual radar pulses even if the frequency differ-ence of successive radar pulses is high. By using a number of two or more RF output paths with signal generators, it is possible to operate each RF output path 2-*i* with a different frequency range and consequently, each RF output path can provide radar signals of a different frequency range. For example, each RF output path may operate in a frequency range of 2 GHz, 4 GHz, 8 GHz. However, it is understood, that any other frequency range or bandwidth of an RF output path 2-*i* may be also possible.

Figure 5:
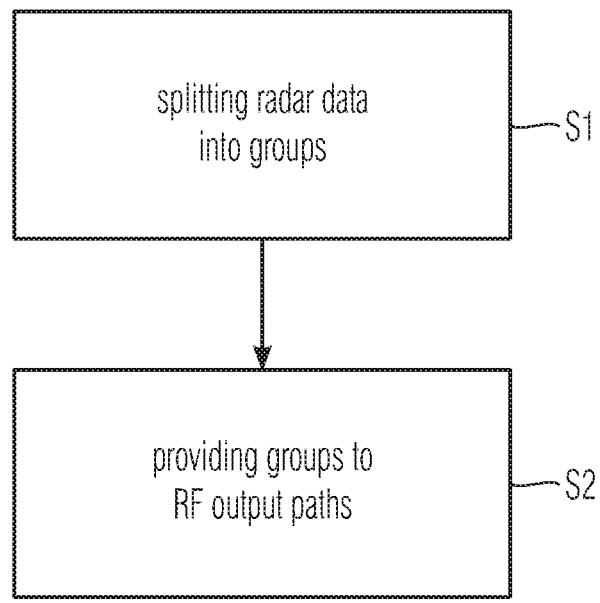
FIG. 5: shows a flow diagram illustrating a method for simulating a radar scenario according to an embodiment.

FIG. 5 shows a flow diagram illustrating a method for simulating a radar scenario according to an embodiment. It is understood, that the method may comprise any step for performing an operation as described above in connection with the system for simulating a radar scenario. Accordingly, the system for simulating a radar scenario may comprise any kind of element for performing an operation as described below in connection with the method for simulating a radar scenario.

The method may comprise a step S1 of splitting radar signals of predetermined radar signal scenario data into multiple groups of radar signals. In particular, the radar signals may be split in multiple groups relating to different frequency bands. The different frequency bands may relate to frequency bands of different RF output paths. The splitting may be performed, for example, by a control unit 1.

The method may further comprise a step S2 of providing each group of radar signals to corresponding RF output paths 2-*i*. As already mentioned above, each RF output path may generate radar signals according to pulse descriptive words.

The method may further comprise a step of controlling an operation of the number of at least two RF output paths 2-*i* simultaneously.

The method may further comprise a step of assigning RF signals of the radar signal scenario data to at least two RF output paths 2-*i* simultaneously.

The method may further comprise a step of assigning multiple RF signals of the RF signal scenario data to a same RF output path 2-*i* simultaneously.

The method may further comprise a step of generating radio frequency signals according to the provided radar signals. In particular, the generation of the radar signals may be performed by the RF output paths 2-*i*.

Summarizing, the present invention relates to an advanced and versatile generation of radar signals for simulating a radar scenario. Radar signals may be generated by multiple RF output paths having different frequency ranges. Accordingly, pulse descriptive words of radar signal simulation data are split into multiple groups according to the frequency or frequency range and the split data are provided to the related RF output path.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon re-viewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not in-tended to be exhaustive or to limit the invention to the precise forms disclosed; ob-viously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 1 simulation controller
2-1, . . . , 2-n RF output path
3 combiner
11 processing unit
12 output interface
13 scenario memory
14 external memory
20-1, . . . , 20-n signal generator
21-1, . . . 21-n input port
22-1, . . . , 22-n output terminal
110, 120 frequency range of RF output path
111,121 radar signals
210,220,230 radar signals
240 radar signal sequence
310, 320, 330 radar signals

The invention claimed is:
1. A system for simulating a radar scenario, the system comprising:
a number of at least two radio frequency, RF, output paths, wherein each RF output path comprises a device adapted for generating radar signals of a specific frequency band, wherein each of the devices of the at least two RF output paths is configured to generate radar signals of a different frequency band, and wherein each of the devices of the at least two RF output paths is configured to operate in a fixed frequency band;
a simulation controller, comprising:
an interface for receiving information on the frequency bands of the at least two RF output paths via a communication link,
an output interface for providing pulse descriptive words, PDW, of radar signals of predetermined radar signal scenario data to the number of at least two RF output paths, wherein the PDW describe parameters of radar pulses, wherein the radar signal scenario data comprises specifications relating to multiple pulses in common, and
a control unit for analyzing a frequency or frequency spectrum of the radar signal scenario data and for splitting the PDW of the radar signal scenario data into multiple groups of radar signals relating to different frequency bands according to the analysis, and for assigning each group of radar signals to a corresponding RF output path; and
a combiner for providing a common output signal by combining the radar signals generated by the devices of the RF output paths such that the common output signal comprises the radar signals of the different frequency bands;
wherein at least one RF output path of the at least two RF output paths is configured to process and output multiple radar signals simultaneously.

2. The system of claim 1, wherein the control unit is configured to assign radar signals to at least two RF output paths simultaneously.

3. The system of claim 1, wherein the control unit is configured to assign multiple radar signals to a same RF output path simultaneously.

4. The system of claim 1, wherein the devices for generating the radar signal are vector signal generators.

5. A method for simulating a radar scenario, the method comprising:
receiving, by a control unit via a communication link, information on frequency bands of at least two radio frequency, RF, output paths, wherein each RF output path comprises a device which generates radar signals of a specific frequency band, wherein each of the devices of the RF output paths is configured to generate radar signals of a different frequency band, and wherein each of the devices of the RF output paths operates in a fixed frequency band;
analyzing, by a control unit, a frequency or frequency spectrum of predetermined radar signal scenario data and splitting pulse descriptive words, PDW, of radar signals of the radar signal scenario data into multiple groups of radar signals relating to different frequency bands according to the analysis, wherein the PDW describe parameters of radar pulses, wherein the radar signal scenario data comprises specifications relating to multiple pulses in common;
providing, by the control unit, each group of radar signals to a corresponding RF output path; and
providing, by a combiner, an output signal by combining the radar signals generated by the devices of the RF out-put paths;

wherein at least one RF output path of the at least two RF output paths processes and outputs multiple radar signals simultaneously.

6. The method of claim 5, comprising controlling, by the control unit, an operation of the number of at least two RF output paths simultaneously.

7. The method of claim 5, comprising assigning, by the control unit, data signals of the radar signal scenario data to at least two RF output paths simultaneously.

8. The method of claim 5, comprising assigning multiple data signals of the radar signal scenario data to a same RF output path simultaneously.

9. The method of claim 5, comprising generating, by the number of RF paths, data signals according to the radar signals provided by the control unit.

* * * * *